US012684710B2

(12) United States Patent
Kano

(10) Patent No.: US 12,684,710 B2
(45) Date of Patent: Jul. 14, 2026

(54) ELECTRONIC DEVICE

(71) Applicant: Murata Manufacturing Co., Ltd.,
Nagaokakyo (JP)

(72) Inventor: Hidekazu Kano, Nagaokakyo (JP)

(73) Assignee: MURATA MANUFACTURING CO.,
LTD., Nagaokakyo (JP)

( * ) Notice: Subject to any disclaimer, the term of this
patent is extended or adjusted under 35
U.S.C. 154(b) by 135 days.

(21) Appl. No.: 18/886,454

(22) Filed: Sep. 16, 2024

(65) Prior Publication Data

US 2025/0008670 A1 Jan. 2, 2025

Related U.S. Application Data

(63) Continuation of application No. PCT/JP2023/017113,
filed on May 2, 2023.

(30) Foreign Application Priority Data

May 10, 2022 (JP) ................................. 2022-077360

(51) Int. Cl.
*G08B 21/18* (2006.01)
*H05K 5/00* (2006.01)
(Continued)

(52) U.S. Cl.
CPC ............. *H05K 5/02* (2013.01); *G08B 21/182*
(2013.01); *H05K 5/0086* (2013.01); *H04R*
*1/1025* (2013.01); *H04R 2201/02* (2013.01)

(58) Field of Classification Search
CPC ...... H05K 5/02; H05K 5/0086; G08B 21/182;
H04R 1/1025; H04R 2201/02;
(Continued)

(56) References Cited

U.S. PATENT DOCUMENTS 7,595,128 B2 * 9/2009 Lee ..................... H01M 10/425
429/61
8,395,519 B2 * 3/2013 Cassidy .............. H01M 50/233
340/636.1
(Continued)

FOREIGN PATENT DOCUMENTS

JP 2009-529209 A 8/2009
JP 2012-114078 A 6/2012
(Continued)

OTHER PUBLICATIONS

International Search Report and Written Opinion in PCT/JP2023/
017113, mailed Jul. 18, 2023, with English translation of the
International Search Report, 11 pages.

*Primary Examiner* — Xanthia C Relford
(74) *Attorney, Agent, or Firm* — ArentFox Schiff LLP

(57) ABSTRACT

An electronic device includes a battery having a first and
second main surface arranged in a Z-axis direction, a rigid
body facing the first main surface, and a sensor that is
attached to the rigid body and detects elastic deformation of
the rigid body generated when force is applied to the rigid
body. The sensor does not overlap the battery when viewed
in the Z-axis direction, and a first waveform of a signal
output from the sensor when force of a first pattern is applied
to the rigid body in a state where the first main surface is in
contact with the rigid body is different from a second
waveform of a signal output from the sensor when the force
of the first pattern is applied to the rigid body in a state where
the first main surface is not in contact with the rigid body.

20 Claims, 11 Drawing Sheets

(51) Int. Cl.
  H05K 5/02         (2006.01)
  H04R 1/1025       (2026.01)
(58) Field of Classification Search
  CPC ..... H04R 7/045; H04R 1/1075; H01M 10/48;
                        H02J 7/00; Y02E 60/10
  See application file for complete search history.

(56)                    References Cited

U.S. PATENT DOCUMENTS

| | | | |
|---|---|---|---|
| 11,024,885 B2 * | 6/2021 | Nishida ............... | H01M 10/058 |
| 2007/0122691 A1 | 5/2007 | Lee et al. | |
| 2012/0126991 A1 | 5/2012 | Cassidy | |
| 2018/0261824 A1 | 9/2018 | Ju et al. | |
| 2020/0136169 A1 | 4/2020 | Nishida et al. | |
| 2021/0075068 A1 | 3/2021 | Jarvis et al. | |

FOREIGN PATENT DOCUMENTS

| | | | | |
|---|---|---|---|---|
| JP | 2020-071961 A | 5/2020 | | |
| JP | 2022-026588 A | 2/2022 | | |
| KR | 20230004093 A * | 1/2023 | ........... | G06F 1/1656 |

* cited by examiner

FIRST WAVEFORM P1

TIME (SECOND)

FIG. 6

SECOND WAVEFORM P2

ELECTRONIC DEVICE

CROSS REFERENCE TO RELATED APPLICATIONS

This application is a continuation of International Application No. PCT/JP2023/017113, filed May 2, 2023, which claims priority to Japanese Patent Application No. 2022-077360, filed May 10, 2022, the contents of each of which are hereby incorporated by reference in their entirety.

TECHNICAL FIELD

The present disclosure is directed to an electronic device including a secondary battery.

BACKGROUND

A configuration related to a conventional electronic device, for example, a method of measuring expansion of a battery as described in United States pre-grant publication No. 2021/0075068 (hereinafter the "'068 Application"), incorporated by reference in its entity, is known. In this method, a sensor for detecting expansion of a battery is attached to the battery.

There is a demand for reducing thickness of the electronic device for detecting expansion of a battery as described in the '068 Application.

SUMMARY OF THE INVENTION

In view of the above, an object of the present disclosure is to reduce thickness of an electronic device for detecting expansion of a secondary battery.

In some aspects, the techniques described herein relate to an electronic device including: a battery having a first main surface and a second main surface arranged in a Z-axis direction; a rigid body facing the first main surface; and a sensor attached to the rigid body and configured to detect elastic deformation of the rigid body generated when force is applied to the rigid body, wherein the sensor does not overlap the battery when viewed in the Z-axis direction, wherein when a force of a first pattern is applied to the rigid body in a first state where the first main surface is in contact with the rigid body, a first waveform of a first signal is output from the sensor, wherein when the force of the first pattern is applied to the rigid body in a second state where the first main surface is not in contact with the rigid body, a second waveform of a second signal is output from the sensor, and wherein the first waveform is different from the second waveform.

In some aspects, the techniques described herein relate to an electronic device including: a battery having a first surface and a second surface; a body facing the first surface; a sensor attached to the body and configured to detect deformation of the body generated when force is applied to the body; a control device; and a notification device; wherein when a force is applied to the body in a first state where the first surface is in contact with the body, a first waveform of a first signal is output via the sensor, wherein when the force is applied to the body in a second state where the first surface is not in contact with the body, a second waveform of a second signal is output via the sensor, and wherein when the first waveform and the second waveform are different from each other the control device outputs notification signal.

According to the present disclosure, a thickness of an electronic device for detecting expansion of a secondary battery can be reduced.

BRIEF DESCRIPTION OF DRAWINGS

In the descriptions that follow, like parts are marked throughout the specification and drawings with the same numerals, respectively. The drawings are not necessarily drawn to scale and certain drawings may be illustrated in exaggerated or generalized form in the interest of clarity and conciseness. The disclosure itself, however, as well as a mode of use, further features and advances thereof, will be understood by reference to the following detailed description of illustrative implementations of the disclosure when read in conjunction with reference to the accompanying drawings, wherein:

FIG. 6 is a waveform diagram of a signal output from the sensor 6 in accordance with aspects of the present disclosure;

DETAILED DESCRIPTION

Figure 1:
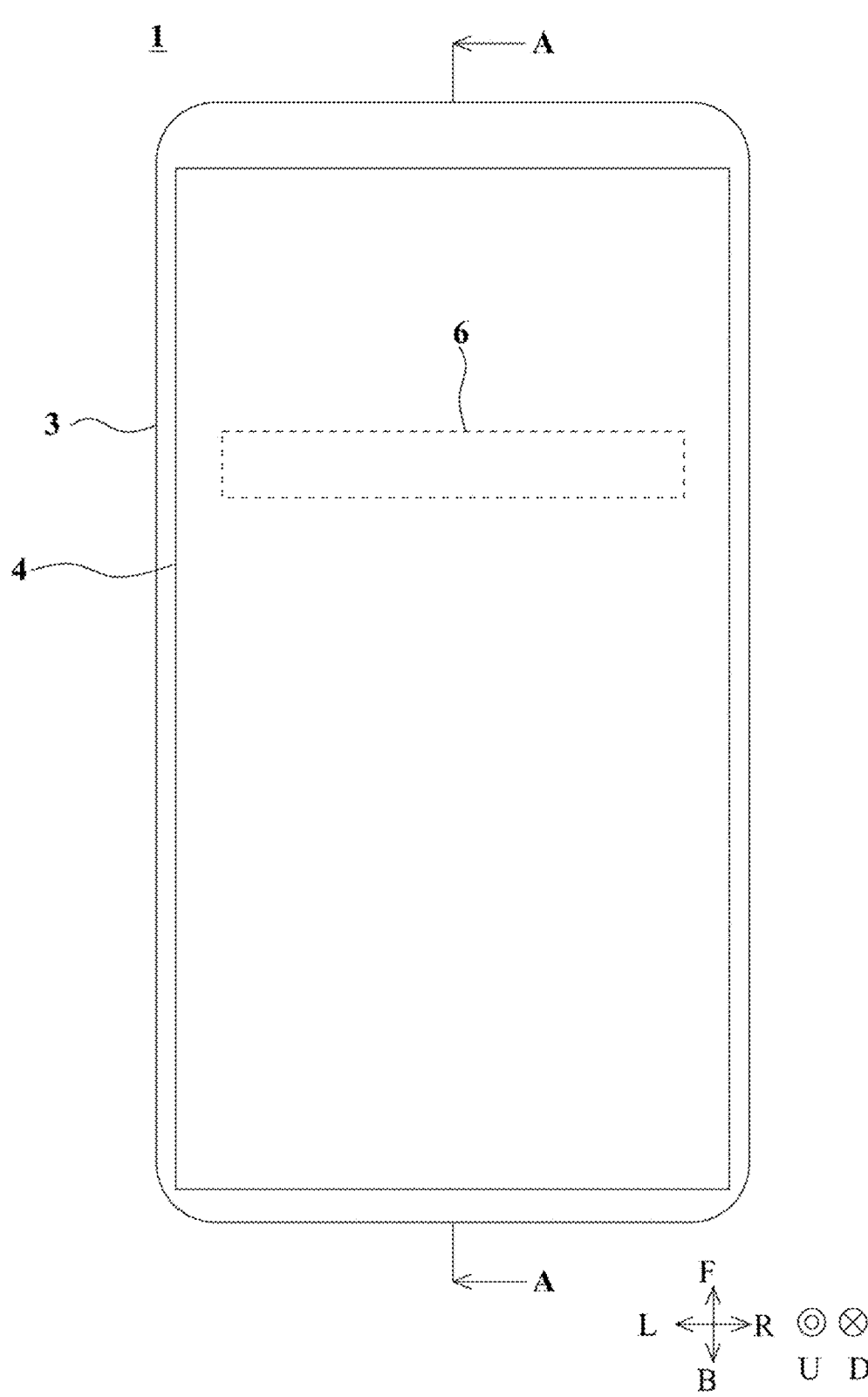
FIG. 1 is a top view of an electronic device 1 in accordance with aspects of the present disclosure.

Hereinbelow, aspects of the present disclosure will be described. In a following description of the drawings, the same or similar components will be represented with use of the same or similar reference characters. The drawings are exemplary, sizes or shapes of portions are schematic, and technical scope of the present disclosure should not be understood with limitation to the aspects.

Figure 2:
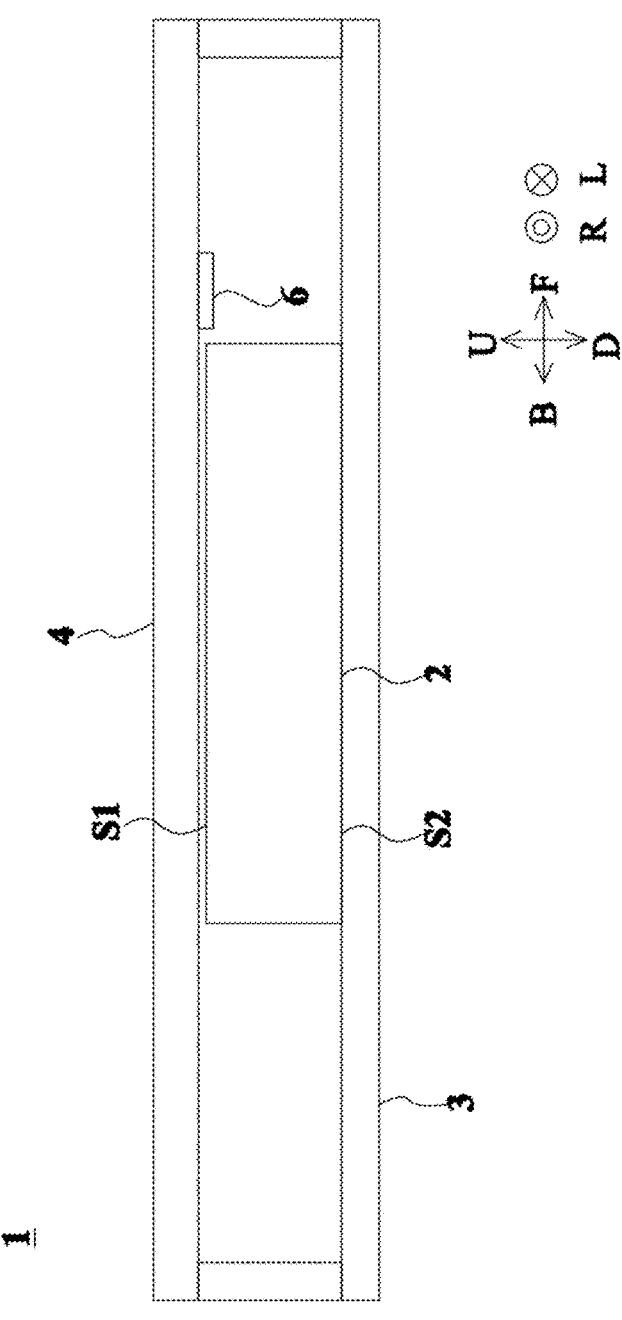
FIG. 2 is a sectional view of the electronic device 1 taken along line A-A in accordance with aspects of the present disclosure.
Figure 3:
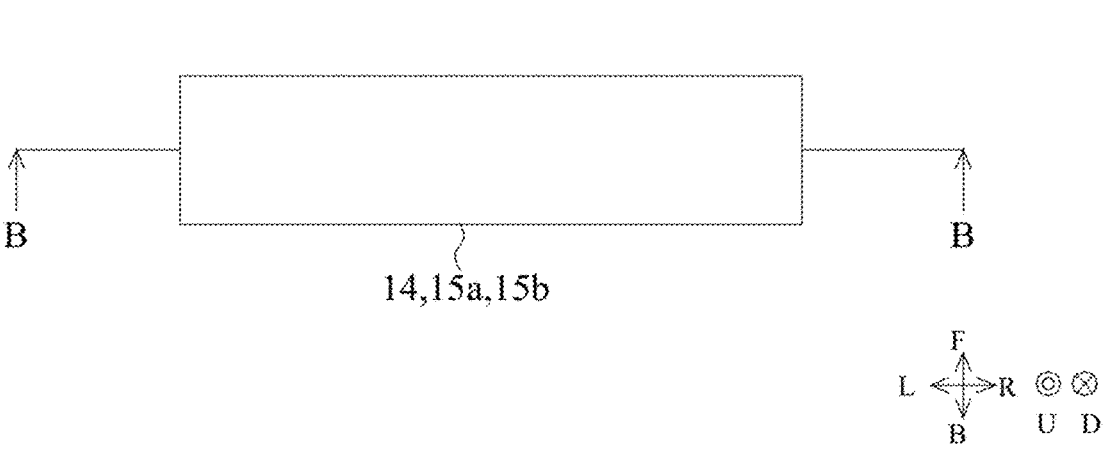
FIG. 3 is a top view of a sensor 6 and a sectional view taken along line B-B in accordance with aspects of the present disclosure.
Figure 4:
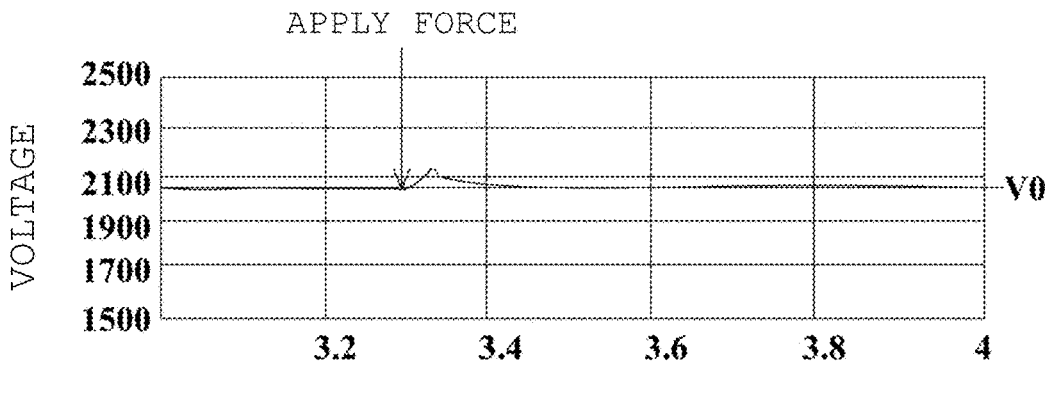
FIG. 4 is a waveform diagram of a signal output from the sensor 6 in accordance with aspects of the present disclosure.
Figure 5:
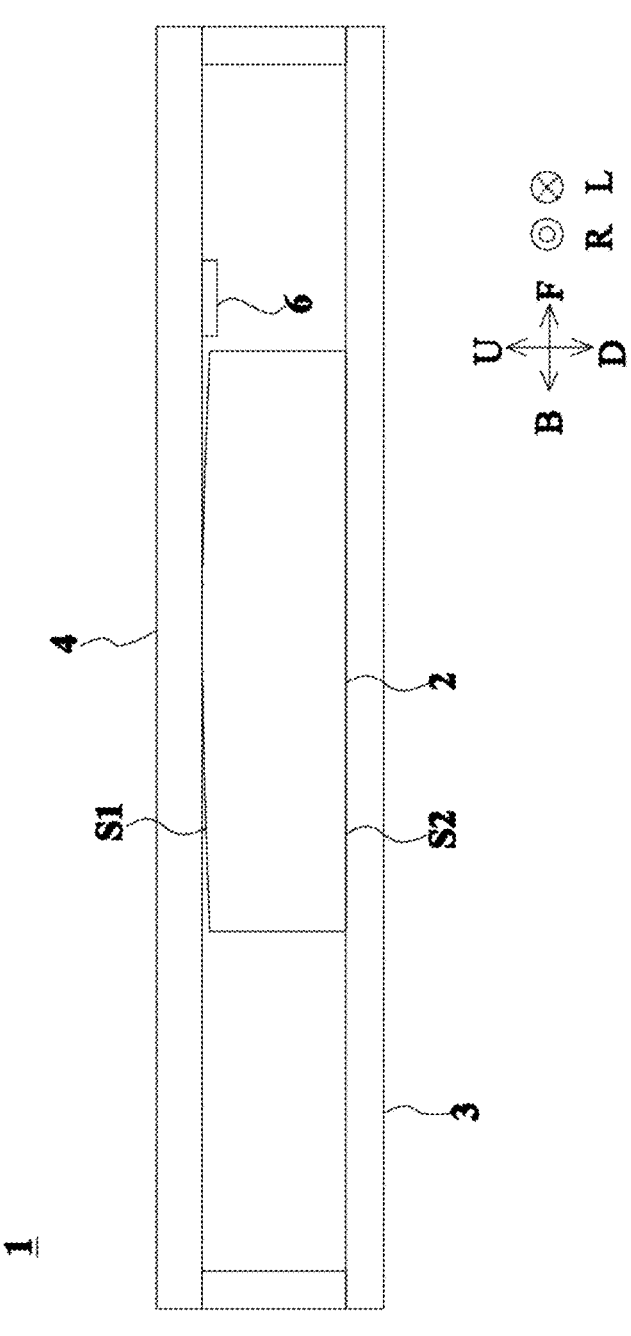
FIG. 5 is a sectional view of the electronic device 1 taken along line A-A in accordance with aspects of the present disclosure.
Figure 6:
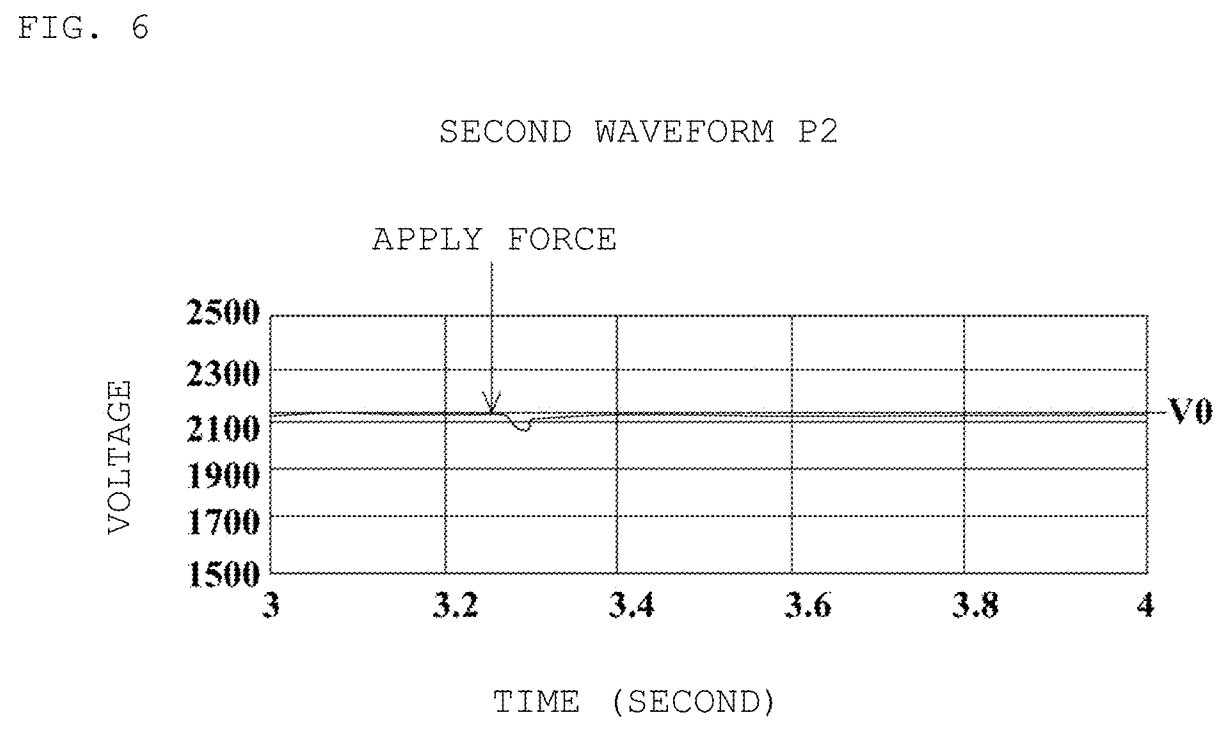

Hereinafter, an electronic device 1 according to an aspect of the present disclosure will be described with reference to the drawings. FIG. 1 is a top view of the electronic device 1. FIGS. 2 and 5 are sectional views of the electronic device 1 taken along line A-A. FIG. 3 is a top view of a sensor 6 and a sectional view taken along line B-B. FIGS. 4 and 6 are waveform diagrams of a signal output from the sensor 6. The vertical axis of FIGS. 4 and 6 represents voltage. The horizontal axis of FIGS. 4 and 6 represents time.

The electronic device 1 is, for example, a portable communication terminal such as a smartphone. In the present description, a direction in which main surfaces of the electronic device 1 are arranged is defined as an up-down direction. A main surface of the electronic device 1 has a rectangular shape. A direction in which a long side of the main surface of the electronic device 1 extends is defined as a front-rear direction. A direction in which a short side of the main surface of the electronic device 1 extends is defined as a left-right direction. The up-down direction, the left-right direction, and the front-rear direction are orthogonal to each other. As illustrated in FIGS. 1 and 2, the electronic device 1 includes a secondary battery 2, a housing 3, a display panel 4, and the sensor 6.

The housing 3 has a rectangular parallelepiped shape. However, an upper surface of the housing 3 is not present as illustrated in FIG. 2. Accordingly, the housing 3 opens in an upward direction. Note, other housing shapes may be implemented.

As illustrated in FIG. 1, the display panel 4 has a rectangular shape when viewed in the up-down direction. As illustrated in FIG. 2, the display panel 4 covers an opening of the housing 3. As described above, the housing 3 and the display panel 4 have a box shape. The display panel 4 may be a rigid body. The display panel 4 may be a liquid crystal display panel or an organic Electroluminescent ("EL") panel. The display panel 4 incorporates a touch panel, although other panels may be implemented.

The secondary battery 2 is, for example, a lithium ion battery and can generally be referred to as a battery. The secondary battery 2 has a first main surface S1 and a second main surface S2 arranged in the up-down direction (Z-axis direction). The first main surface S1 is located higher than the second main surface S2. The secondary battery 2 is arranged in a space surrounded by the housing 3 and the display panel 4. The secondary battery 2 is located below the display panel 4. As described above, the display panel 4 (rigid body) faces the first main surface S1. A distance between the first main surface S1 and the display panel 4 (rigid body) is smaller than a thickness in the up-down direction of the sensor 6 in a state where the secondary battery 2 is not expanded. For example, a distance between the first main surface S1 and the display panel 4 (rigid body) is 0.3 mm or more and 1.5 mm or less in a state where the secondary battery 2 is not expanded.

The sensor 6 is attached to the display panel 4 (rigid body). In accordance with an aspect of the disclosure, the sensor 6 is attached to a lower main surface of the display panel 4. The sensor 6 does not overlap the secondary battery 2 when viewed in the up-down direction (Z-axis direction). The sensor 6 detects elastic deformation of the display panel 4 (rigid body) caused by application of force to the display panel 4 (rigid body). Hereinafter, the sensor 6 will be described in detail below.

The sensor 6 has a rectangular shape, for example, when viewed in the up-down direction. The sensor 6 has a long side extending in the left-right direction. As illustrated in FIG. 3, the sensor 6 includes a piezoelectric film 14, an upper electrode 15a, and a lower electrode 15b. The piezoelectric film 14 has a sheet shape. Therefore, the piezoelectric film 14 has an upper main surface and a lower main surface. Length of the piezoelectric film 14 in the left-right direction is longer than length of the piezoelectric film 14 in the front-rear direction. In accordance with an aspect of the present disclosure, the piezoelectric film 14 has a rectangular shape having long sides extending in the left-right direction as viewed in the up-down direction. The piezoelectric film 14 generates an electric charge according to an amount of deformation of the piezoelectric film 14. In accordance with an aspect of the present disclosure, the piezoelectric film 14 is a PLA film. The piezoelectric film 14 will be described below in more detail below.

The piezoelectric film 14 has a characteristic in which polarity of an electric charge generated when the piezoelectric film 14 is stretched in the left-right direction is opposite to polarity of an electric charge generated when the piezoelectric film 14 is stretched in the front-rear direction. Specifically, the piezoelectric film 14 is a film formed of a chiral polymer. The chiral polymer is, for example, polylactic acid (PLA), particularly poly-L-lactic acid (PLLA). PLLA including a chiral polymer has a main chain with a helical structure. The PLLA has piezoelectricity in which molecules are oriented when uniaxial stretching is performed. The piezoelectric film 14 has a piezoelectric constant of d14. A uniaxial stretching direction (orientation direction) of the piezoelectric film 14 forms an angle of 45 degrees with respect to each of the front-rear direction and the left-right direction. This angle of 45 degrees includes, for example, angles ranging from 45 degrees plus around 10 degrees to 45 degrees minus around 10 degrees. By the above, the piezoelectric film 14 generates an electric charge when the piezoelectric film 14 is stretched in the left-right direction or contracted in the left-right direction. The piezoelectric film 14 generates a negative charge when the piezoelectric film 14 is stretched in the left-right direction, for example. The piezoelectric film 14 generates a positive charge when the piezoelectric film 14 is contracted in the left-right direction, for example. Magnitude of an electric charge depends on an amount of deformation of the piezoelectric film 14 due to stretching or contraction. More precisely, the magnitude of the electric charge is proportional to a differential value of an amount of deformation of the piezoelectric film 14 due to stretching or contraction.

The upper electrode 15a is a signal electrode. A detection signal is output from the upper electrode 15a. The upper electrode 15a is arranged on an upper main surface of the piezoelectric film 14. The lower electrode 15b is a ground electrode. The lower electrode 15b is connected to the ground. The lower electrode 15b is provided on a lower main surface of the piezoelectric film 14.

Note that the electronic device 1 further includes a current and voltage conversion circuit and an amplifier circuit. However, the current and voltage conversion circuit and the amplifier circuit are general circuits and will be omitted from the description.

In the sensor 6, as described above, the upper electrode 15a is fixed to a lower main surface of the display panel 4 with a double-sided tape or the like. As described above, when the display panel 4 is pressed in a downward direction by the user, the sensor 6 extends in the front-rear direction. As a result, as illustrated in FIG. 4, the sensor 6 outputs a signal having positive voltage with respect to reference potential V0.

When charging and discharging are repeated, the secondary battery 2 expands as illustrated in FIG. 5. As a result, the first main surface S1 of the secondary battery 2 comes into contact with the display panel 4. In this example, as illustrated in FIG. 6, the sensor 6 outputs a signal having negative voltage with respect to the reference potential V0. As described above, a first waveform P1 (see FIG. 4) of a signal output from the sensor 6 when force of a first pattern is applied to the display panel 4 (rigid body) in a state where the first main surface S1 is in contact with the display panel 4 (rigid body) is different from a second waveform P2 (see FIG. 6) of a signal output from the sensor 6 when force of the first pattern is applied to the display panel 4 (rigid body) in a state where the first main surface S1 is not in contact with the display panel 4 (rigid body). In accordance with an aspect of the present disclosure, polarity of the first waveform P1 with respect to the reference potential V0 is different from polarity of the second waveform P2 with respect to the reference potential V0.

Figure 7:
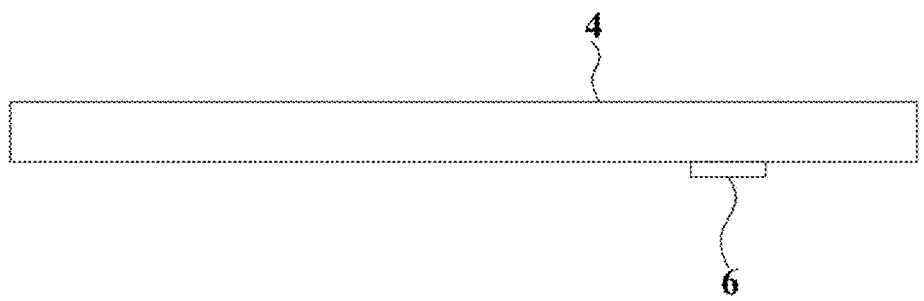
FIG. 7 is a front view of a display panel 4 and the sensor 6 in accordance with aspects of the present disclosure.
Figure 8:
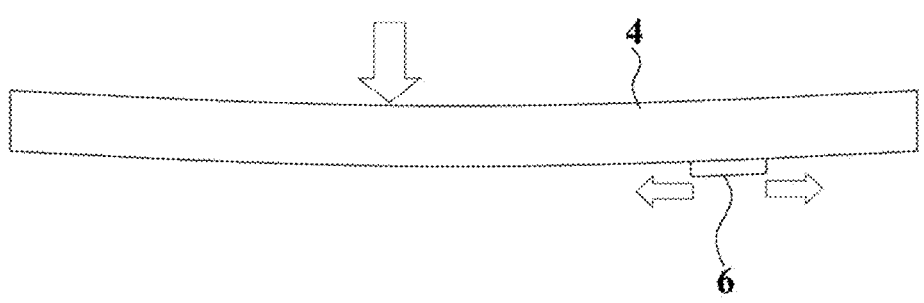
FIG. 8 is a front view of the display panel 4 and the sensor 6 in accordance with aspects of the present disclosure.
Figure 9:
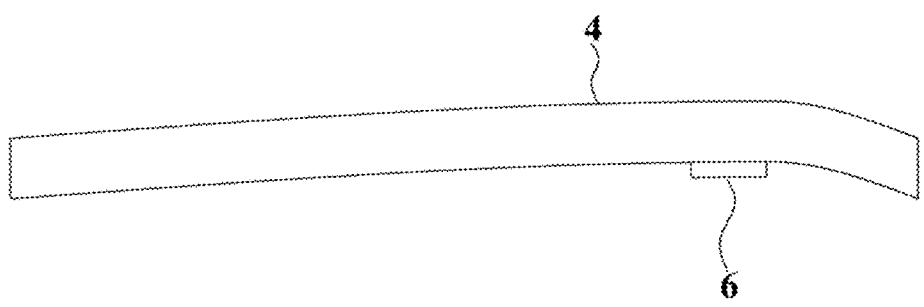
FIG. 9 is a front view of the display panel 4 and the sensor 6 in accordance with aspects of the present disclosure.
Figure 9:
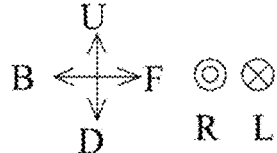
Figure 10:
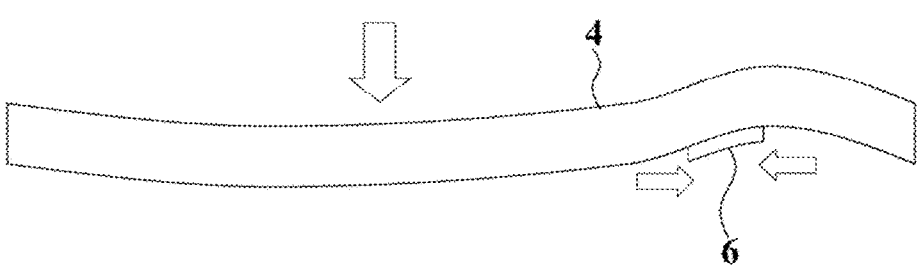
FIG. 10 is a front view of the display panel 4 and the sensor 6 in accordance with aspects of the present disclosure.

A reason why polarity of the first waveform P1 with respect to the reference potential V0 is different from polarity of the second waveform P2 with respect to the reference potential V0 will be described with reference to the drawings below. FIGS. 7 to 10 are front views of the display panel 4 and the sensor 6. In FIGS. 7 and 8, the first main surface S1 is not in contact with the display panel 4. In FIGS. 9 and 10, the first main surface S1 is in contact with the display panel 4.

As illustrated in FIG. 7, in a state where the first main surface S1 is not in contact with the display panel 4 and no force is applied to the display panel 4, the display panel 4 has a flat plate shape. Then, when the user pushes the display panel 4 in the downward direction, the display panel 4 is curved so as to project in the downward direction as illustrated in FIG. 8. The sensor 6 is also curved together with the display panel 4. Then, the sensor 6 is extended in the front-rear direction. As described above, and as illustrated in FIG. 4, the sensor 6 outputs a signal having positive voltage with respect to the reference potential V0.

In another aspect, as illustrated in FIG. 9, when the first main surface S1 is in contact with the display panel 4, the display panel 4 is curved so as to project in the upward direction. When the user presses the display panel 4 in the downward direction in this state, as illustrated in FIG. 10, the display panel 4 is deformed such that a portion pressed by the user projects in the downward direction and a portion where the sensor 6 is provided projects in the upward direction. The sensor 6 is also curved together with the display panel 4. Then, the sensor 6 is compressed in the front-rear direction. As described above, and as illustrated in FIG. 6, the sensor 6 outputs a signal having negative voltage with respect to the reference potential V0.

Figure 11:
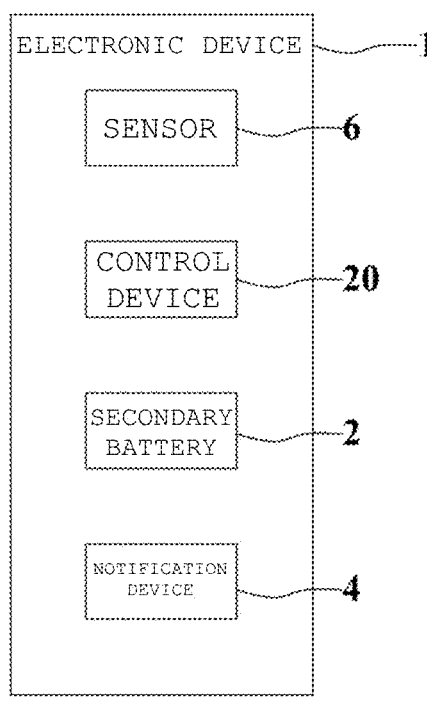
FIG. 11 is a block diagram of the electronic device 1 in accordance with aspects of the present disclosure.
Figure 12:
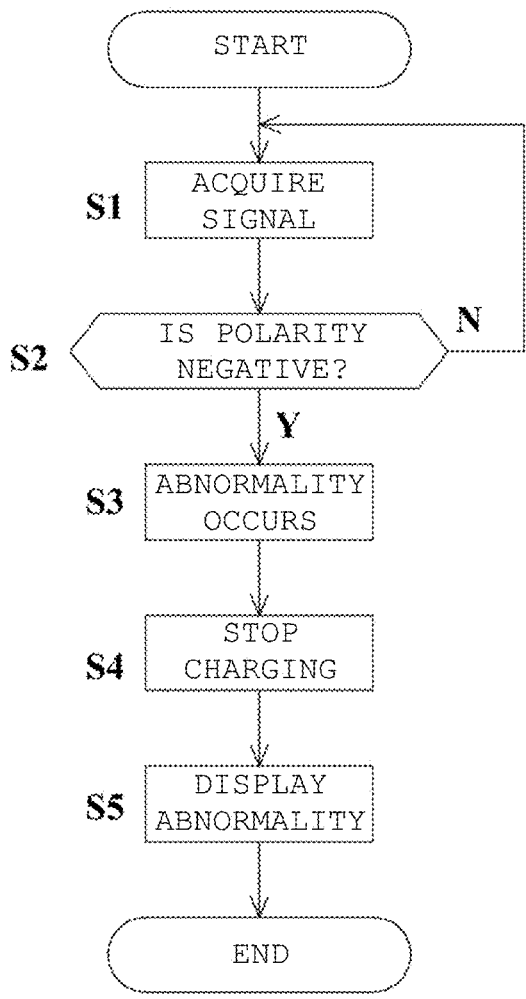
FIG. 12 is a flowchart executed by a control device 20 of the electronic device 1 in accordance with aspects of the present disclosure.

As described above, in the electronic device 1, the first waveform P1 of a signal output from the sensor 6 when force of a first pattern is applied to the display panel 4 in a state where the first main surface S1 is in contact with the display panel 4 is different from the second waveform P2 of a signal output from the sensor 6 when the force of the first pattern is applied to the display panel 4 in a state where the first main surface S1 is not in contact with the display panel 4. In view of the above, the electronic device 1 can determine whether or not abnormality occurs in the secondary battery 2 based on a signal output from the sensor 6. Hereinafter, operation performed by the electronic device 1 will be described with reference to the drawings. FIG. 11 is a block diagram of the electronic device 1. FIG. 12 is a flowchart executed by a control device 20 of the electronic device 1.

As illustrated in FIG. 11, the electronic device 1 further includes the control device 20. The control device 20 is, for example, a central processing unit (CPU). The control device 20 executes a program stored in a storage device (not illustrated) to execute the flowchart illustrated in FIG. 12.

The control device 20 acquires a signal from the sensor 6 (Step S1). Next, the control device 20 determines whether or not polarity of the signal acquired in Step S1 is negative (Step S2). In a case where the polarity of the signal is negative, the processing proceeds to Step S3. In a case where the polarity of the signal is not negative, the processing returns to Step S1.

In a case where the polarity of the signal is negative, the first main surface S1 is in contact with the display panel 4 due to expansion of the secondary battery 2. In view of the above, the control device 20 determines that abnormality occurs in the secondary battery 2 (Step S3). The control device 20 stops charging the secondary battery 2 (Step S4). Then, the control device 20 displays that the abnormality occurs in the display panel 4 (Step S5). This ends the present processing.

According to the electronic device 1, the thickness of the electronic device 1 for detecting expansion of the secondary battery 2 can be reduced. More specifically, in a method of measuring expansion of a battery as described in the '068 Application, a sensor for detecting expansion of a battery is attached to the battery. In this case, a space having total thickness of thickness of the sensor and thickness of the battery needs to be present in a housing.

On the other hand, the electronic device 1 includes the sensor 6 that detects elastic deformation of the display panel 4 caused by application of force to the display panel 4. Then, the first waveform P1 of a signal output from the sensor 6 when force of a first pattern is applied to the display panel 4 in a state where the first main surface S1 is in contact with the display panel 4 is different from the second waveform P2 of a signal output from the sensor 6 when the force of the first pattern is applied to the display panel 4 in a state where the first main surface S1 is not in contact with the display panel 4. As described above, the control device 20 can determine whether or not the first main surface S1 is in contact with the display panel 4 based on a waveform of a signal. For example, the control device 20 can detect expansion of the secondary battery 2. Then, the sensor 6 does not overlap the secondary battery 2 when viewed in the up-down direction. For this reason, a space having thickness of the secondary battery 2 may only need to be present in the housing 3. From the above, according to the electronic device 1, the thickness of the electronic device 1 for detecting expansion of the secondary battery 2 can be reduced. For example, the sensor 6 can be provided while capacity of the secondary battery 2 of the electronic device 1 is maintained.

Further, according to the electronic device 1, the electronic device 1 can be downsized. More specifically, the sensor 6 detects elastic deformation of the display panel 4. For this reason, the control device 20 can calculate magnitude of force with which the user presses the display panel 4 by using a signal of the sensor 6. Therefore, the sensor 6 functions as a pressing sensor and an expansion sensor of the secondary battery 2. As a result, since two sensors are unnecessary in the electronic device 1, the electronic device 1 can be downsized.

Figure 13:
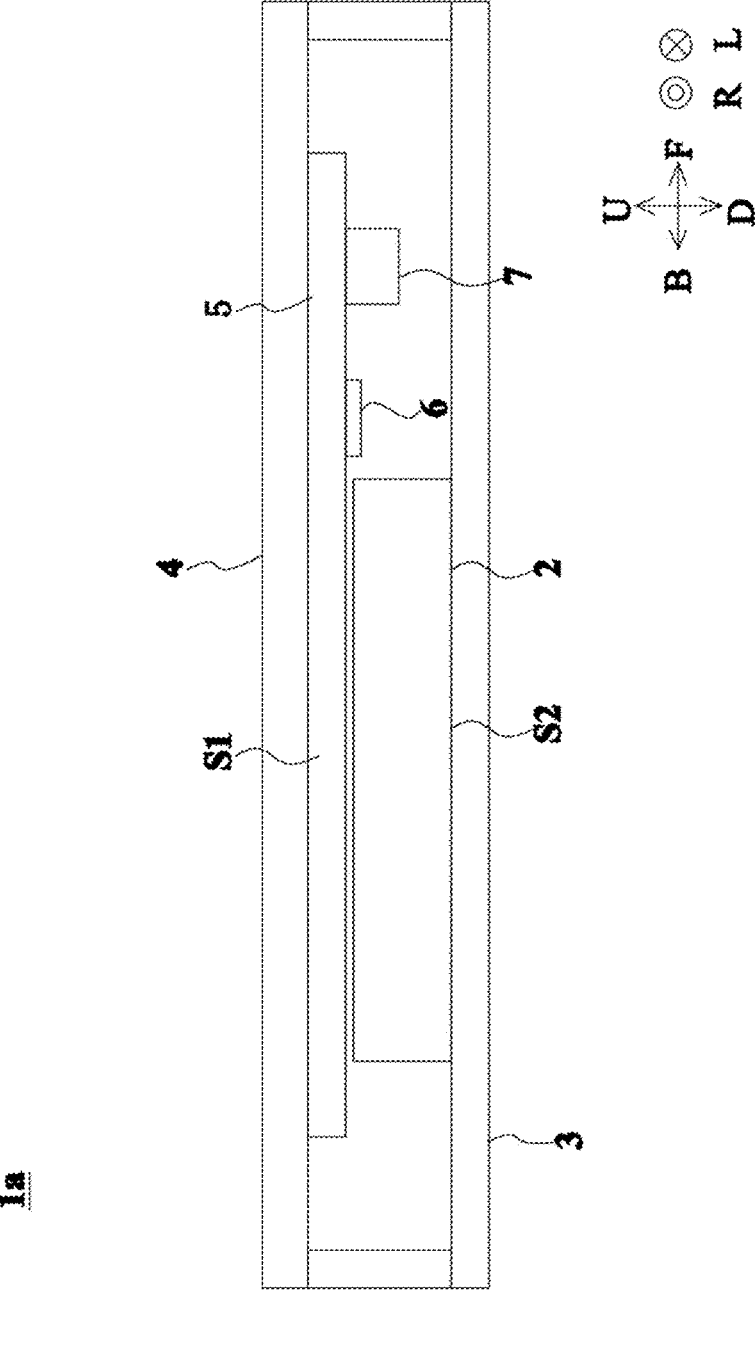
FIG. 13 is a sectional view of an electronic device 1a in accordance with aspects of the present disclosure.

Hereinafter, an electronic device 1a according to a first variation will be described with reference to the drawings. FIG. 13 is a sectional view of the electronic device 1a.

The electronic device 1a is different from the electronic device 1 in that the electronic device 1a further includes a rigid body 5 and a deformation generation device 7. The rigid body 5 is, for example, a part of a housing of the electronic device 1a, a frame, a circuit board, or the like.

The deformation generation device 7 generates elastic deformation of the rigid body 5 by applying force to the rigid body 5. The deformation generation device 7 is a vibrator. The vibrator is, for example, a Linear Resonant Actuators ("LRA"), a voice coil motor, an eccentric motor, or the like. Therefore, the deformation generation device 7 vibrates. The rigid body 5 is elastically deformed by vibration of the deformation generation device 7.

The sensor 6 is attached to the rigid body 5. A distance between the sensor 6 and the secondary battery 2 is shorter than a distance between the sensor 6 and the deformation generation device 7. Then, the sensor 6 detects elastic deformation of the rigid body 5 generated by application of force to the rigid body 5 by the deformation generation device 7. The first waveform P1 of a signal output from the sensor 6 when force of a first pattern is applied to the rigid body 5 in a state where the first main surface S1 is in contact with the rigid body 5 is different from the second waveform P2 of a signal output from the sensor 6 when the force of the first pattern is applied to the rigid body 5 in a state where the first main surface S1 is not in contact with the rigid body 5. Other structures of the electronic device 1a are the same as those of the electronic device 1, described above, and thus omitted from description.

Since a distance between the sensor 6 and the secondary battery 2 is shorter than a distance between the sensor 6 and the deformation generation device 7, the rigid body 5 changes as illustrated in FIG. 10.

Figure 14:
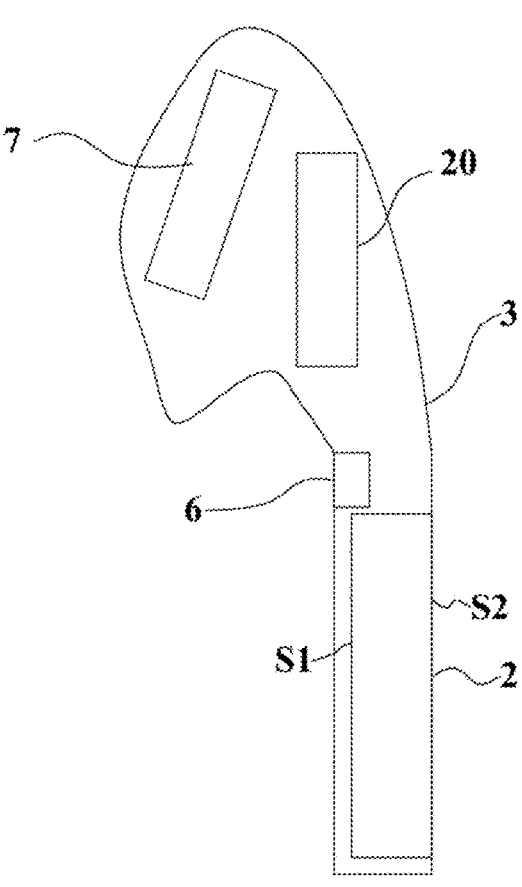
FIG. 14 is a sectional view of an electronic device 1b in accordance with aspects of the present disclosure.

Hereinafter, an electronic device 1b according to a second variation will be described with reference to the drawings. FIG. 14 is a sectional view of the electronic device 1b.

The electronic device 1b is a wireless earphone. The electronic device 1b includes the secondary battery 2, the housing 3, the sensor 6, the deformation generation device 7, and the control device 20. The deformation generation device 7 is a speaker. The deformation generation device 7 vibrates the housing 3 when generating sound. As a result, the deformation generation device 7 generates elastic deformation in the housing 3 (rigid body) by applying force to the housing 3 (rigid body). The sensor 6 is attached to the housing 3 (rigid body), and detects elastic deformation of the housing 3 (rigid body) generated by application of force to the housing 3 (rigid body). Other structures of the electronic device 1b are the same as those of the electronic device 1a, and thus omitted from description.

The electronic device according to the present disclosure is not limited to the electronic devices 1, 1a, and 1b, and can be modified within the scope of the gist of the present disclosure.

Note that structures of the electronic devices 1, 1a, and 1b may be optionally combined.

Note that polarity with respect to the reference potential V0 of the first waveform P1 may not need to be different from polarity with respect to the reference potential V0 of the second waveform P2. Therefore, the first waveform P1 is preferably different from the second waveform P2. That is, polarity with respect to the reference potential V0 of the second waveform P2 may be the same as polarity with respect to the reference potential V0 of the first waveform P1.

Note that in a case where polarity of a signal is negative, the control device 20 notifies the user of abnormality of the secondary battery 2. That is, in a case where polarity with respect to the reference potential V0 of the first waveform P1 is different from polarity with respect to the reference potential V0 of the second waveform P2, the control device 20 notifies the user of abnormality of the secondary battery 2. However, in a case where the first waveform P1 and the second waveform P2 are different from each other, the control device 20 may notify the user of abnormality of the secondary battery 2 by the display panel 4 (notification device).

Note that in a case where polarity of a signal is negative, the control device 20 stops charging the secondary battery 2. That is, in a case where polarity with respect to the reference potential V0 of the first waveform P1 is different from polarity with respect to the reference potential V0 of the second waveform P2, the control device 20 stops charging the secondary battery 2. However, in a case where the first waveform P1 and the second waveform P2 are different from each other, the control device 20 may stop charging the secondary battery 2.

Note that a flexible printed circuit board including a wiring of the sensor 6 may be integrated with the sensor 6.

Note that the control device 20 may notify the user of abnormality of the secondary battery 2 through a speaker. Note that the sensor 6 may be a sensor that detects a grip by the user of a game controller. Further, in a case where the electronic devices 1 and 1a are smartwatches, the sensor 6 may be a sensor that detects a pulse of the user. A material of the rigid body 5 is, for example, glass, metal, ceramic, or resin.

In general, the description of the aspects disclosed should be considered as being illustrative in all respects and not being restrictive. The scope of the present disclosure is shown by the claims rather than by the above description and is intended to include meanings equivalent to the claims and all changes in the scope. While preferred aspects of the invention have been described above, it is to be understood that variations and modifications will be apparent to those skilled in the art without departing from the scope and spirit of the invention.

DESCRIPTION OF REFERENCE SYMBOLS

1, 1a, 1b: Electronic device
2: Secondary battery
3: Housing
4: Display panel
5: Rigid body
6: Sensor
7: Deformation generation device
20: Control device
S1: First main surface
S2: Second main surface

What is claimed:

1. An electronic device comprising:
a battery having a first main surface and a second main surface arranged in a Z-axis direction;
a rigid body facing the first main surface; and
a sensor attached to the rigid body and configured to detect elastic deformation of the rigid body generated when force is applied to the rigid body,
wherein the sensor does not overlap the battery when viewed in the Z-axis direction,
wherein, when a force of a first pattern is applied to the rigid body in a first state where the first main surface is in contact with the rigid body, a first waveform of a first signal is output from the sensor,
wherein, when the force of the first pattern is applied to the rigid body in a second state where the first main surface is not in contact with the rigid body, a second waveform of a second signal is output from the sensor, and
wherein the first waveform is different from the second waveform.

2. The electronic device according to claim 1, wherein a polarity with respect to a reference potential of the first waveform is different from a polarity with respect to the reference potential of the second waveform.

3. The electronic device according to claim 1, further comprising a deformation generation device configured to generate an elastic deformation of the rigid body by applying force to the rigid body.

4. The electronic device according to claim 1, further comprising:

a control device; and a notification device, wherein the control device is configured to notify a user of an abnormality of the battery by the notification device when the first waveform and the second waveform are different from each other.

5. The electronic device according to claim 1, further comprising a control device configured to stop charging the battery when the first waveform and the second waveform are different from each other.

6. The electronic device according to claim 1, wherein a distance between the first main surface and the rigid body is smaller than a thickness in the Z-axis direction of the sensor.

7. The electronic device according to claim 1, wherein a distance between the first main surface and the rigid body is 1.5 mm or less.

8. The electronic device according to claim 1, wherein the first main surface is configured to contact the rigid body as the battery expands.

9. The electronic device according to claim 1, wherein the electronic device is at least one of an earphone, a smartphone, or a portable communication terminal.

10. An electronic device comprising:

a battery having a first surface and a second surface;

a body facing the first surface;

a sensor attached to the body and configured to detect deformation of the body generated when force is applied to the body;

a control device; and a notification device;

wherein, when a force is applied to the body in a first state where the first surface is in contact with the body, a first waveform of a first signal is output via the sensor, wherein, when the force is applied to the body in a second state where the first surface is not in contact with the body, a second waveform of a second signal is output via the sensor, and wherein the control device is configured to output a notification signal when the first waveform and the second waveform are different from each other.

11. The electronic device according to claim 10, wherein the notification signal notifies a user of an abnormality of the battery by the notification device.

12. The electronic device according to claim 10, wherein a polarity with respect to a reference potential of the first waveform is different from a polarity with respect to the reference potential of the second waveform.

13. The electronic device according to claim 10, further comprising a deformation generation device configured to generate an elastic deformation of the body by applying force to the body.

14. The electronic device according to claim 10, wherein the control device is configured to stop charging the battery when the first waveform and the second waveform are different from each other.

15. The electronic device according to claim 10, wherein the first surface and the second surface are arranged in a Z-axis direction.

16. The electronic device according to claim 15, wherein the sensor does not overlap the battery when viewed in the Z-axis direction.

17. The electronic device according to claim 15, wherein a distance between the first surface and the body is smaller than a thickness in the Z-axis direction of the sensor.

18. The electronic device according to claim 10, wherein a distance between the first surface and the body is 1.5 mm or less.

19. The electronic device according to claim 10, wherein the first surface is configured to contact the body as the battery expands.

20. The electronic device according to claim 10, wherein the electronic device is at least one of an earphone, smartphone, a portable communication terminal.

* * * * *